(12) United States Patent
Yoshida et al.

(10) Patent No.: US 8,164,001 B2
(45) Date of Patent: Apr. 24, 2012

(54) MULTILAYER PRINTED CIRCUIT BOARD

(75) Inventors: Shigeyoshi Yoshida, Sendai (JP); Koichi Kondo, Sendai (JP); Hiroshi Ono, Sendai (JP); Satoshi Arai, Sendai (JP); Tadashi Kubodera, Ebina (JP)

(73) Assignee: NEC Tokin Corporation, Sendai-Shi (JP)

( * ) Notice: Subject to any disclaimer, the term of this patent is extended or adjusted under 35 U.S.C. 154(b) by 1147 days.

(21) Appl. No.: 11/986,432

(22) Filed: Nov. 21, 2007

(65) Prior Publication Data

US 2009/0047507 A1    Feb. 19, 2009

(30) Foreign Application Priority Data

Nov. 22, 2006   (JP) .................. 2006-316209
Jul. 24, 2007   (JP) .................. 2007-191929
Aug. 27, 2007  (JP) .................. 2007-219541

(51) Int. Cl.
*H05K 1/03* (2006.01)

(52) U.S. Cl. .................... 174/255; 174/259

(58) Field of Classification Search ........... 174/255–259
See application file for complete search history.

(56) References Cited

U.S. PATENT DOCUMENTS

| | | | | |
|---|---|---|---|---|
| 5,695,877 | A | * | 12/1997 | Davis .................. 428/329 |
| 6,075,211 | A | * | 6/2000 | Tohya et al. .............. 174/255 |
| 7,108,799 | B2 | * | 9/2006 | Kobayashi et al. ........ 252/62.62 |
| 2004/0012935 | A1 | | 1/2004 | Tagi et al. |
| 2004/0124941 | A1 | * | 7/2004 | Awakura et al. ............. 333/12 |
| 2004/0238796 | A1 | | 12/2004 | Abe |

FOREIGN PATENT DOCUMENTS

| | | |
|---|---|---|
| CN | 1476292 A | 2/2004 |
| JP | 7-142249 A | 6/1995 |
| JP | 2004-056144 A | 2/2004 |
| JP | 2004-111956 A | 4/2004 |
| JP | 2005-032969 A | 2/2005 |
| JP | 2005-129766 A | 5/2005 |
| JP | 2006-019590 A | 1/2006 |
| JP | 2006-100608 A | 4/2006 |
| JP | 2006-108557 A | 4/2006 |
| JP | 2006-210616 A | 8/2006 |
| JP | 2006-294769 A | 10/2006 |
| WO | 03/015109 A1 | 2/2003 |

OTHER PUBLICATIONS

Chinese Office Action dated Sep. 11, 2009 and English translation thereof issued in a counterpart Chinese Application No. 2007101864985.
Japanese Office Action dated Dec. 8, 2011 (and English translation thereof) in counterpart Japanese Application No. 2007-219541.

* cited by examiner

*Primary Examiner* — Jeremy Norris
(74) *Attorney, Agent, or Firm* — Holtz, Holtz, Goodman & Chick, PC

(57) ABSTRACT

A multilayer printed circuit board includes an inner magnetic layer essentially consisting of magnetic material. The inner magnetic layer may be formed by an action of chemical bond or van der Waals force. The inner magnetic layer may comprise a plurality of magnetic units, each of which provides magnetism, and may be formed by magnetically coupling the magnetic units with each other by using a strong interaction. The inner magnetic layer may essentially consist of a ferrite film. The ferrite film may be formed directly on the inner conductive layer by means of an electroless plating method. The ferrite film may essentially consist of an oxide metal composition, the metal composition being represented by the formula of $Fe_a Ni_b Zn_c Co_d$, where: $a+b+c+d=3.0$; $2.1 \leq a \leq 2.7$; $0.1 \leq b \leq 0.3$; $0.1 \leq c \leq 0.7$; and $0 \leq d \leq 0.15$.

2 Claims, 9 Drawing Sheets

MULTILAYER PRINTED CIRCUIT BOARD

BACKGROUND OF THE INVENTION

This invention relates to a printed circuit board on which an electronic component such as a semiconductor element is mounted. In particular, the present invention relates to a multilayer printed circuit board.

In a recent electronic device having a multilayer printed circuit board and an electronic component mounted thereon, a high-frequency current flows into a power-supply layer or a ground layer of the multilayer printed circuit board because of various reasons. For example, electromagnetic coupling between a power-supply layer and a signal layer causes a high-frequency current to flow into the power-supply layer. A weakened ground layer causes a high-frequency current to flow into the ground layer. A length of a return-current path also influences a high-frequency current flowing into the ground layer. The flow of the high-frequency current into the power-supply layer or the ground layer constitutes a large current-loop which may cause a noise radiation problem.

Since such noise is radiated from an inner layer of a multilayer printed circuit board, a noise suppression sheet stuck on an outer surface of the multilayer printed circuit board has little effect on reduction of the noise.

JP-A 2006-100608 or JP-A 2006-019590 discloses a pre-impregnation sheet that is, at least in part, formed of magnetic material, those documents being incorporated herein by reference. A multilayer printed circuit board formed of the pre-impregnation material can suppress the above-mentioned noise radiated from the inside thereof. However, in order to obtain desirable noise suppression property in practical use, the pre-impregnation material with the magnetic material becomes very thicker. The thicker pre-impregnation material results in a larger multilayer printed circuit board larger. Therefore, there is a need for a new structure that can suppress the above-mentioned noise with small size.

SUMMARY OF THE INVENTION

According to one aspect of the present invention, a multilayer printed circuit board includes an inner magnetic layer essentially consisting of magnetic material. The inner magnetic layer may be formed by an action of chemical bond or van der Waals force. The inner magnetic layer may comprise a plurality of magnetic units, each of which provides magnetism, and may be formed by magnetically coupling the magnetic units with each other by using a strong interaction. The inner magnetic layer may essentially consist of a ferrite film. The ferrite film may be formed directly on the inner conductive layer by means of an electroless plating method. The ferrite film may essentially consist of an oxide metal composition, the metal composition being represented by the formula of $Fe_aNi_bZn_cCo_d$, where: $a+b+c+d=3.0$; $2.1 \leq a \leq 2.7$; $0.1 \leq b \leq 0.3$; $0.1 \leq c \leq 0.7$; and $0 \leq d \leq 0.15$.

An appreciation of the objectives of the present invention and a more complete understanding of its structure may be had by studying the following description of the preferred embodiment and by referring to the accompanying drawings.

Figure 1:
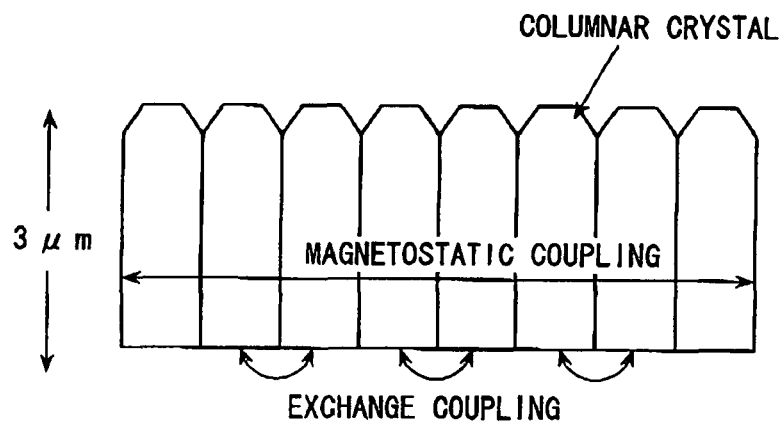
FIG. 1 is a view schematically showing a magnetic interaction in a ferrite film according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

The present inventor have studied the problem of JP-A 2006-100608 or JP-A 2006-019590 and have found out the cause of the problem. First explanation will be made about the cause of the problem.

In general, when a noise suppression member or material is disposed directly on a transmission line such as a signal pattern formed on a printed circuit board, its noise suppression effect is represented by the following formula (1):

$$\frac{P_{loss}}{P_{in}} \propto M \cdot \mu'' \cdot f \cdot \delta, \tag{1}$$

where $P_{loss}/P_{in}$ shows noise suppression effect per unit line length, M is coupling coefficient between the noise suppression member and high-frequency magnetic flux caused by a current flowing the transmission line, and $\delta$ is a thickness of the noise suppression member.

Coupling coefficient M is influenced by a clearance between the noise suppression member and the transmission line; a large clearance may remarkably deteriorate the coupling coefficient M. Therefore, removal of the clearance is required to obtain a large noise suppression effect. However, if a composite magnetic sheet is used as a noise suppression member, an adhesive tape is used to fix the composite magnetic sheet to the transmission line; it is difficult to omit the adhesive tape in practical use. The thickness of the adhesive tape deteriorates the coupling coefficient M of the composite magnetic sheet. In addition, the general complex magnetic material as disclosed in P-A 2006-100608 or JP-A 2006-019590 comprises magnetic particles and a polymer binding them. The polymer also provides substantial gaps between the transmission line and the magnetic particles. The substantial gaps also cause the deterioration of the coupling coefficient M of the composite magnetic sheet.

With reference to the formula (1), a property of a noise suppression member also depends upon a magnitude of imaginary part permeability $\mu''$ of the noise suppression member and its frequency characteristic or its distribution profile. Especially, the following three conditions are very important: 1) a product ($\mu_i \times f_r$) of initial permeability $\mu_i$ and a resonance frequency $f_r$ is large; 2) the resonance frequency $f_r$ is controllable in a wide frequency range; and 3) the distribution profile changes abruptly towards its peak. The product ($\mu_i \times f_r$) is influenced by saturation magnetization $M_s$ and an anisotropic magnetic field $H_a$ unique to a used material as well as the shapes of the material. The initial permeability $\mu_i$ and the resonance frequency $f_r$ are represented by the following formulas (2) and (3), respectively, and the initial permeability $\mu_i$ and the resonance frequency $f_r$ meet the following formula (4):

$$\mu_i = \frac{2M_s}{3H_a\mu_0} \quad (2)$$

$$f_r(\text{for bulk}) = \frac{\gamma}{2\pi} H_a \quad (3)$$

$$f_r \cdot \mu_i = \frac{\gamma M_s}{3\pi\mu_0}, \quad (4)$$

where $\mu_0$ is permeability of vacuum.

As understood from the formula (4), the product ($\mu_i \times f_r$) is proportional to saturation magnetization $M_s$. In other words, the product ($\mu_i \times f_r$) is basically constant if the materials have the same saturation magnetization $M_s$; this is the Snoek's law.

Furthermore, a noise suppression member of a complex magnetic material or a pre-impregnation sheet including the noise suppression member is also influenced by another demagnetizing field $N_d(X) \times M_s$ along a magnetic path. The demagnetizing field $N_d(x) \times M_s$ depends upon the shapes of the magnetic particles. It is assumed that the above-mentioned demagnetizing field $N_d(x) \times M_s$ is caused by keeping the magnetic particles away from each other by the nonmagnetic polymer. The demagnetizing field $N_d(x) \times M_s$ influences on effective permeability $\mu_e$ of a magnetic material in an open magnetic path, as represented by the following formula (5). Thus, the noise suppression member of the complex magnetic material or the pre-impregnation sheet has extremely small effective permeability $\mu_e$ along the magnetic path.

$$\mu_e \neq \frac{1}{N_d(x)} \quad (5)$$

As understood form the formula (1), a noise suppression effect of a noise suppression member further depends upon the large thickness δ of the noise suppression member. However, the large thickness δ of the noise suppression member makes a large distance between conductive layers in a multilayer printed circuit board. Since the large distance between the conductive layers increases noise radiation, the large thickness δ of the noise suppression member cannot be adopted in practical use.

In order to solve the problem of the JP-A 2006-100608 or JP-A 2006-019590, it is desirable that a noise suppression member or material has a large coupling coefficient M and a large product ($\mu_i \times f_r$) but has a small thickness δ. In general, it is impossible to obtain a large product ($\mu_i \times f_r$) over the constraint of the Snoek's law. However, if the shape of the noise suppression member is considered as an additional coefficient, a demagnetizing field $N_d(z) \times M_s$ along its thickness direction serves to heighten the precession energy of the spin. By using the demagnetizing field $N_d(z) \times M_s$, the formula (3) is rewritten into the following formula (6):

$$f_r(\text{for film}) = \frac{\gamma}{2\pi} \cdot \sqrt{\frac{H_a \cdot N_d(z) \cdot M_s}{\mu_0}} \quad (6)$$

Note here that anisotropic magnetic field $H_a$, saturation magnetization $M_s$ and permeability $\mu_0$ of vacuum meet the following condition: $H_a \times M_s/\mu_0 \gg 1$. In consideration of the condition, a magnetic film has a larger demagnetizing field $N_d(z) \times M_s$ in comparison with that of a magnetic bulk that has the chemical composition same as the magnetic film. Therefore, the magnetic film has a resonance frequency $f_r$ higher than the magnetic bulk. For example, the ferrite-plated film has a product ($\mu_i \times f_r$) larger by an order of magnitude than that of a sintered ferrite bulk or a thick film magnetic material. In addition, the magnetic film essentially consisting of magnetic material, ex. the above-mentioned ferrite-plated film, has a large coupling coefficient M in comparison with a complex magnetic material, because of no polymer and no adhesive sheet. In consideration of the demagnetizing field $N_d(x) \times M_s$ of the composite magnetic sheet, the magnetic film essentially consisting of magnetic material has a product ($\mu_i \times f_r$) larger than that of the composite magnetic sheet. Furthermore, the magnetic film has a thickness δ smaller than manufacturing tolerances of the printed circuit board; the small thickness δ does not influence the size of the printed circuit board.

Based on the above discussion, a multilayer printed circuit board according to an embodiment of the present invention includes an inner magnetic layer, which essentially consists of magnetic material and is formed by an action of chemical bond or van der Waals force without using any non-magnetic binder such as a polymer. Specifically, the ferrite-plated film is used as the inner magnetic layer in the present embodiment. The ferrite-plated film is formed by a ferrite plating method. Preferably, the ferrite-plated film is formed by an electroless plating method.

For example, the ferrite plating method is a method as disclosed in U.S. Pat. No. 4,477,319, the contents of which are incorporated herein by reference in their entireties. The ferrite plating method of the present embodiment comprises the steps of: preparing a specific solution containing at least ferrous ions; bringing a surface of a target into the specific solution to cause $Fe^{2+}$ ions, or $Fe^{2+}$ ions and other metal hydroxide ions, to be absorbed on the surface of the target; oxidizing the absorbed $Fe^{2+}$ ions to obtain $Fe^{3+}$ ions to cause the $Fe^{3+}$ ions and metal hydroxide ions in the specific solution to undergo a ferrite crystallization reaction so that a ferrite film is formed on the surface of the target. The target of the ferrite plating according to the present embodiment is, for example, an inner conductor layer included in the multilayer printed circuit board of the present embodiment.

Figure 2:
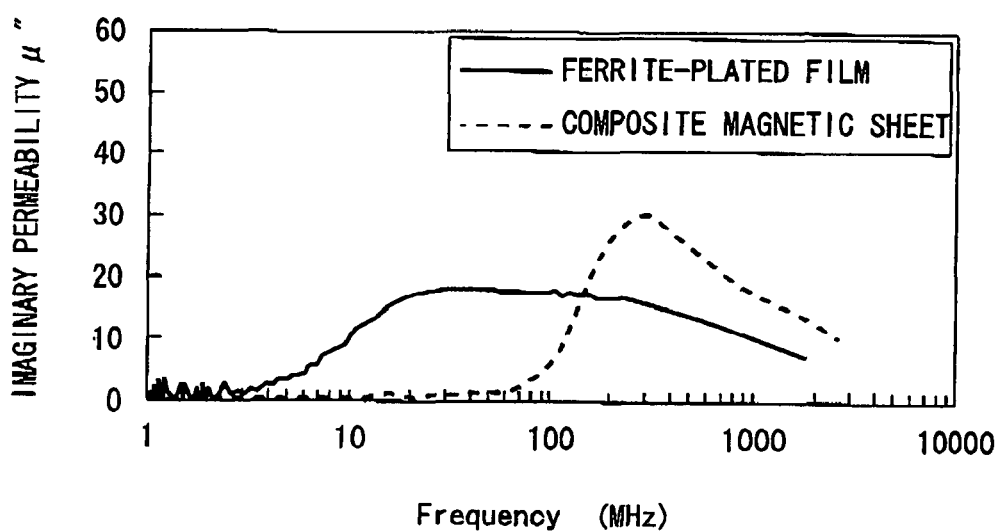
FIG. 2 is a view schematically showing imaginary permeability ($\mu''$) properties of an existing noise suppression sheet made of complex magnetic material and a ferrite film according to an embodiment of the present invention.

As shown in FIG. 1, the ferrite-plated film comprises a plurality of columnar crystals, which have high homogeneity. In the ferrite-plated film, neighboring ones of the columnar crystals are magnetically coupled with each other by a strong exchange interaction. Therefore, the ferrite-plated film has small variation of anisotropic magnetic fields. The small variation of anisotropic magnetic fields causes its distribution profile of frequency property to change abruptly towards its peak so that the ferrite-plated film can provide a suitable noise suppression effect without reducing a signal frequency. In addition, because the above-mentioned exchange interaction makes an extremely small demagnetizing field $N_d(x) \times M_s$ along a magnetic path, the effective permeability $\mu_e$ of the ferrite film is substantially equal to the permeability unique to the material. The permeability distribution property of the ferrite film is based on the ferromagnetic resonance thereof and is therefore superior to that of a composite magnetic sheet, as shown in FIG. 2. Furthermore, since the ferrite-plated film can be formed directly on an inner conductive layer of the multilayer printed circuit and the ferrite-plated film includes no polymer, there is no clearance or gap between the ferrite-plated film and the inner conductive layer. Therefore, the coupling coefficient M of the ferrite film is very close to its theoretical maximum value ($M_{max}=1$). Thus, the ferrite film has the large coupling coefficient M and the large product ($\mu_i \times f_r$) within the noise frequency range but has the small thickness $\delta$. Therefore, the ferrite film has a superior noise suppression effect when used within a multilayer printed circuit board.

With reference to IEC62333-2 defined in the IEC (International Electrotechnical Commission) as a property evaluation standard of a noise suppression sheet, a micro-strip line (MSL) board was prepared by fabricating a double-sided printed circuit board, and conduction noise suppression effect of the ferrite-plated film was evaluated.

Figure 3A:
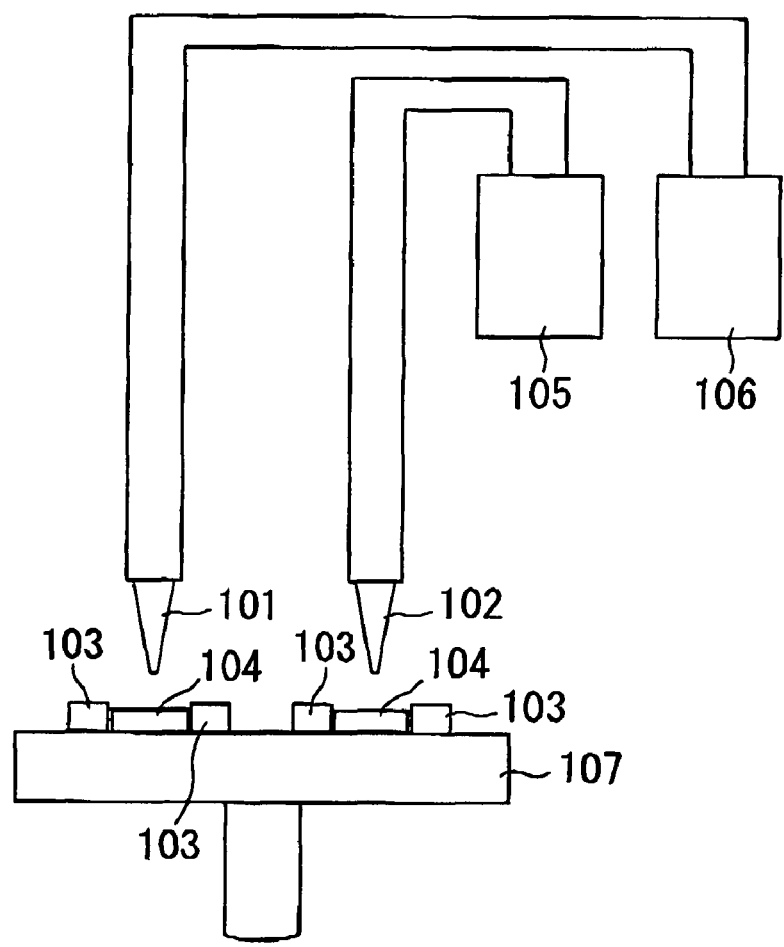
FIG. 3A is a view schematically showing a film formation apparatus that is used for forming a ferrite film according to an embodiment of the present invention.
Figure 3B:
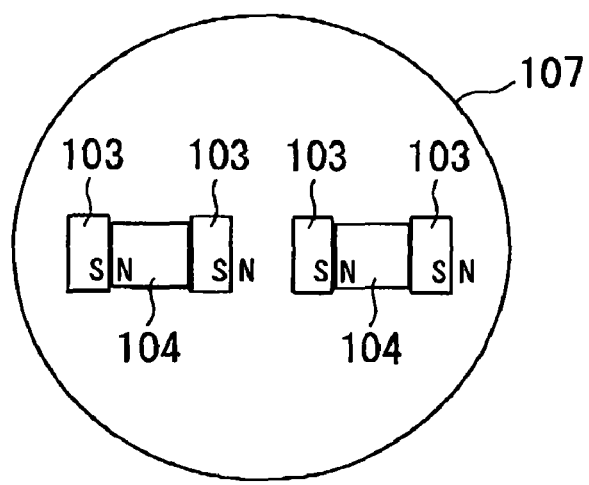
FIG. 3B is a top view schematically showing an arrangement of targets onto a turn table of the film formation apparatus of FIG. 3A.

Ferrite films for evaluation were formed by using a film formation apparatus as schematically shown in FIGS. 3A and 3B. The illustrated film formation apparatus comprises nozzles 101, 102, permanent magnets 103, tanks 105, 106 and a turn table 107. The tanks 105, 106 contain the solutions for ferrite plating and other solutions for oxidization; the solutions for ferrite plating have the respective compositions as shown in the above table.

In order to form ferrite films by the use of the illustrated apparatus, targets 104 were put onto the turn table 107 so that each target 104 was positioned between two permanent magnets 103, as shown in FIG. 3B. The permanent magnets 103 were used to apply onto the surface of the target 104 a magnetic field parallel to the surface to control magnetic anisotropy in the ferrite-plated film. The desirable magnitude of the applied magnetic field in this embodiment is 0~50 Oe; the magnitude may be determined in response to the desirable magnitude of the magnetic anisotropy. The solutions were provided from the tanks 105, 106 onto the targets 104 through the nozzles 101, 102. Upon the provision of the solutions, first and second steps were repeatedly performed in turn so as to form the ferrite films on the targets 104, wherein the first step is of providing the solution onto one of the targets 104 through the nozzle 101, followed by removing excess liquid of the solution by using a centrifugal force of the turn table 107; likewise, the second step is of providing the solution onto the targets 104 through the nozzle 102, followed by removing excess liquid of the solution by using a centrifugal force of the turn table 107.

More in detail, MSL boards or polyimide sheets were prepared as the targets 104 and were mounted on the turn table 107. Each MSL board comprised a glass epoxy board that had a thickness of 1.6 mm and a shape of 80 mm square. One surface of the glass epoxy board was formed with a strip conductor, while the other surface of the glass epoxy board was formed with a ground conductor of a uniform pattern. The strip conductor was positioned on the center line of the surface of the glass epoxy board and had a width of about 3 mm and a length 80 mm. The MSL's characteristic impedance was 50 Ω. The MSL board was mounted on the turn table 107 so that the ground conductor was in contact with the turn table 107. On the other hand, each polyimide sheet had a thickness of 25 μm and a shape of 8 cm square.

Next, the turn table 107 was turned at 150 rpm while deoxidized ion-exchange water was provided on the MSL board or the polyimide sheet under a heat condition up to 90° C. Next, nitrogen gas was introduced into the film formation apparatus so that deoxide atmosphere was created in the apparatus. Each solution for ferrite plating (reaction solution) was formed by dissolving $FeCl_2\text{-}4H_2O$, $NiCl_2\text{-}6H_2O$, $ZnCl_2$, $CoCl_2\text{-}6H_2O$ into deoxidized ion-exchange water for each film shown in the following table 1. On the other hand, an oxidizing solution is formed by dissolving $NaNO_2$ and $CH_3COONH_4$ into deoxidized ion-exchange water. The reaction solution and the oxidizing solution were provided onto the targets 104 through the nozzles 101, 102, wherein each of their flow rates is about 40 ml/min. As a result of the above processes, black ferrite films were formed on the surfaces of the targets 104, respectively.

TABLE 1

| | ID | Target | Film Composition (mol %) | | | | L (mm) | t (μm) | L/t | μa' at 50 MHz | μb' at 50 MHz | μa'/μb' at 50 MHz | μ" at 5 GHz | t × μ" at 5 GHz (μm) | fr (MHz) |
|---|---|---|---|---|---|---|---|---|---|---|---|---|---|---|---|
| | | | Fe | Ni | Zn | Co | | | | | | | | | |
| Example | #1 | MSL | 2.5 | 0.2 | 0.3 | 0.00 | 80 | 3.0 | 26667 | 40 | 40 | 1 | 15 | 45 | 400 |
| Comparative Example | #2 | Polyimide Sheet | 2.5 | 0.2 | 0.3 | 0.00 | 80 | 3.0 | 26667 | 45 | 45 | 1 | 13 | 39 | 300 |
| Example | #3 | MSL | 2.5 | 0.2 | 0.3 | 0.00 | 80 | 4.0 | 20000 | 38 | 38 | 1 | 14 | 56 | 390 |
| Example | #4 | MSL | 2.4 | 0.3 | 0.3 | 0.00 | 80 | 2.2 | 36364 | 38 | 38 | 1 | 15 | 33 | 410 |
| Example | #5 | MSL | 2.5 | 0.2 | 0.3 | 0.00 | 80 | 0.8 | 100000 | 34 | 34 | 1 | 13 | 10 | 410 |
| Comparative Example | #6 | MSL | 2.5 | 0.2 | 0.3 | 0.00 | 80 | 0.5 | 160000 | 41 | 41 | 1 | 15 | 8 | 410 |
| Example | #7 | MSL | 2.2 | 0.1 | 0.7 | 0.00 | 80 | 2.3 | 34783 | 120 | 120 | 1 | 8 | 18 | 100 |
| Example | #8 | MSL | 2.5 | 0.2 | 0.3 | 0.01 | 80 | 3.0 | 26667 | 40 | 34 | 0.8 | 15 | 45 | 400 |
| Example | #9 | MSL | 2.1 | 0.2 | 0.6 | 0.15 | 80 | 3.0 | 26667 | 32 | 16 | 2.0 | 10 | 30 | 400 |
| Example | #10 | MSL | 2.1 | 0.2 | 0.6 | 0.14 | 80 | 3.1 | 25806 | 15 | 30 | 0.5 | 10 | 31 | 400 |

TABLE 1-continued

| | | | | | | | | | | | | | | |
|---|---|---|---|---|---|---|---|---|---|---|---|---|---|---|
| Comparative Example | #11 | MSL | 2.3 | 0.2 | 0.4 | 0.07 | 80 | 2.9 | 27586 | 35 | 5 | 7.0 | 11 | 32 | 400 |
| Comparative Example | #12 | MSL | 2.3 | 0.2 | 0.4 | 0.06 | 80 | 3.0 | 26667 | 5 | 36 | 0.1 | 11 | 33 | 410 |
| Comparative Example | #13 | MSL | 2.3 | 0.2 | 0.3 | 0.20 | 80 | 2.0 | 40000 | 5 | 5 | 1 | 4 | 8 | 2500 |
| Example | #14 | MSL | 2.7 | 0.2 | 0.1 | 0.00 | 80 | 3.0 | 26667 | 35 | 35 | 1 | 12 | 36 | 430 |
| Comparative Example | #15 | MSL | 2.8 | 0.1 | 0.1 | 0.00 | 80 | 3.0 | 26667 | 34 | 34 | 1 | 11 | 33 | 440 |

| | | | MSL Transmission Characteristic (Line Parallel to Direction for μa') | | | | MSL Transmission Characteristic (Line Parallel to Direction for μb') | | | |
|---|---|---|---|---|---|---|---|---|---|---|
| | ID | ρDC ($\Omega_{cm}$) | S11 at 50 MHz (dB) | ΔPloss/Pin at 50 MHz | ΔPloss/Pin at 1 GHz | ΔPloss/Pin at 5 MHz | S11 at 50 MHz (dB) | Ploss/Pin at 50 MHz | Ploss/Pin at 1 GHz | ΔPloss/Pin at 5 GHz |
| Example | #1 | 8.E+03 | −30 | 0 | 0 | 1 | −30 | 0 | 0 | 1 |
| Comparative Example | #2 | 8.E+03 | −32 | 0 | 0 | 0 | −32 | 0 | 0 | 0 |
| Example | #3 | 2.E+02 | −20 | 0 | 0 | 1 | −20 | 0 | 0 | 1 |
| Example | #4 | 9.E+03 | −35 | 0 | 0 | 1 | −35 | 0 | 0 | 1 |
| Example | #5 | 9.E+03 | −40 | 0 | 0 | 0 | −40 | 0 | 0 | 0 |
| Comparative Example | #6 | 9.E+03 | −42 | 0 | 0 | 0 | −42 | 0 | 0 | 0 |
| Example | #7 | 2.E+05 | −36 | 0 | 0 | 1 | −35 | 0 | 0 | 1 |
| Example | #8 | 8.E+03 | −31 | 0 | 0 | 1 | −30 | 0 | 0 | 1 |
| Example | #9 | 8.E+05 | −36 | 0 | 0 | 0 | −43 | 0 | 0 | 1 |
| Example | #10 | 1.E+06 | −44 | 0 | 0 | 1 | −36 | 0 | 0 | 0 |
| Comparative Example | #11 | 2.E+04 | −38 | 0 | 0 | 0 | −42 | 0 | 0 | 1 |
| Comparative Example | #12 | 2.E+04 | −42 | 0 | 0 | 1 | −38 | 0 | 0 | 0 |
| Comparative Example | #13 | 3.E+04 | −42 | 0 | 0 | 0 | −42 | 0 | 0 | 0 |
| Example | #14 | 1.E−01 | −28 | 0 | 0 | 1 | −28 | 0 | 0 | 1 |
| Comparative Example | #15 | 7.E−02 | −18 | 0 | 0 | 1 | −18 | 0 | 0 | 1 |

※... μ" was measured along a direction parallel to a greater one of μa' and μb'

Figure 4:
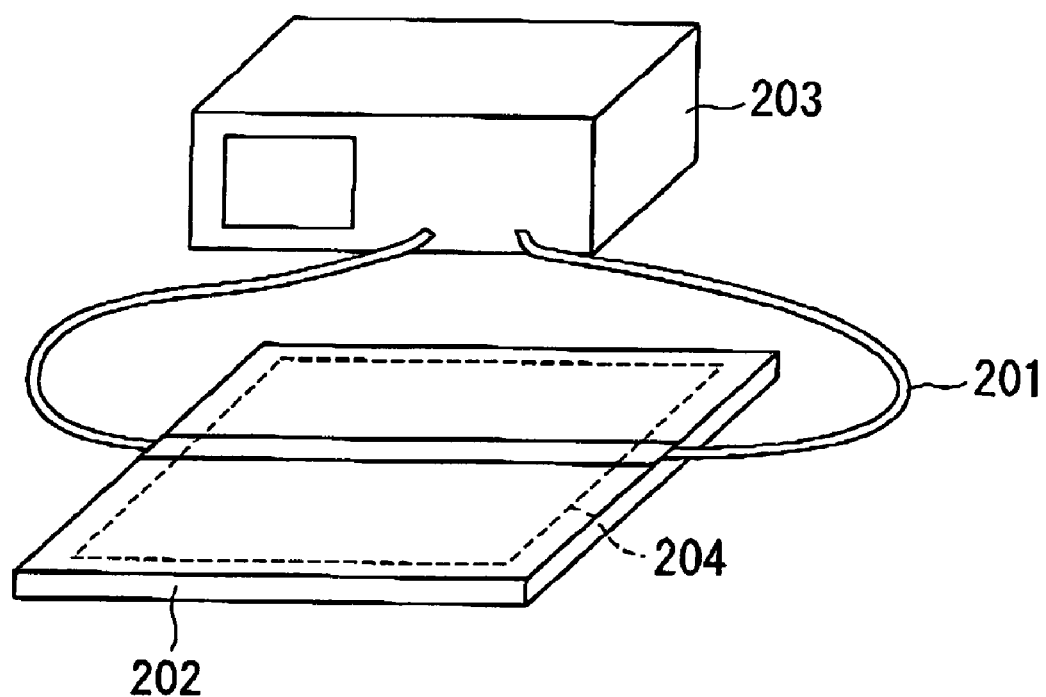
FIG. 4 is a view schematically showing an evaluation system for evaluating noise suppression result, which is used in an embodiment of the present invention.

Analyses were carried out on the thus obtained ferrite films. Their permeability-frequency characteristics were measured by using a permeameter (i.e. permeability measurer) based on the shielded deep coil method. Their transmission loss $\Delta P_{loss}/P_{in}$ were measured as their noise suppression effects by using an evaluation system illustrated in FIG. 4. In FIG. 4, a reference numeral 202 indicates an MSL board or a polyimide sheet, and another reference numeral 204 indicates the ferrite film formed thereon. As shown in FIG. 4, both ends of the MSL board 202 were connected to a network analyzer 203 by using coaxial cables 201. In a case of the polyimide sheet, the measurement was carried out while the polyimide sheet was disposed on a simple MSL board with no ferrite film, and uniform weighting was applied on the sheet by using a weight of 500 g. Their results were standardized with respect to a simple MSL board formed with no ferrite film. The standardized results and other measured properties are shown in the above table 1, wherein μ'a is real part permeability of each ferrite film along a direction "a" parallel to its surface, μ'b is real part permeability of the ferrite film along another direction "b" parallel to the surface of the film but perpendicular to the direction "a".

The transmission loss $\Delta P_{loss}/P_{in}$ of each ferrite film was calculated on the basis of the following formulas (7) and (8):

$$\frac{P_{loss}}{P_{in}} = 1 - (|\Gamma^2| + |T^2|) \quad (7)$$

$$\frac{\Delta P_{loss}}{P_{in}} = \frac{P_{loss}}{P_{in}(MSL + \text{Ferrite})} - \frac{P_{loss}}{P_{in}(MSL)}, \quad (8)$$

where Γ and T are reflection coefficient and transparent coefficient, respectively, and are defined by the following formulas (9) and (10), respectively.

$$S_{11} = 20 \log|\Gamma| \quad (9)$$

$$S_{21} = 20 \log|T| \quad (10)$$

In the table 1, "t" is a thickness of each ferrite film, and "L" is a minimum length of each ferrite film. As apparent from the table 1, each ferrite film except for the ferrite films #6 and #13 has a product (μ"×t) equal to or greater than 10 μm. In addition, each ferrite film meets the conditions of t≦50 μm and L/t≧1000. In other words, every ferrite film is so sufficiently thin that its demagnetizing field $N_d(x) \times M_s$ is very small. Furthermore, each of the ferrite films except for the ferrite film #15 has a sufficiently small reflection property ($S_{11}$) due to its resistivity PDc not smaller than 0.1 Ωm, irrespective of its large area size. In particular, each of the ferrite films except for the ferrite films #11 and #12 meets the condition of 0.5≦x≦2.0, where x is μ'a/μ'b, because each film has very small magnetic anisotropy or no magnetic anisotropy in its plane. In addition, each of the ferrite films #1, #3, #4, #5, #7, #8, #9, #10 and #14 essentially consists of an oxide metal composition, the metal composition being represented by the formula of $Fe_aNi_bZn_cCo_d$, where: a+b+c+d=3.0; 2.1≦a≦2.7; 0.1≦b≦0.3; 0.1≦c≦0.7; and 0≦d≦0.15. As the result, each of the ferrite films #1, #3, #4, #5, #7, #8, #9, #10 and #14 has an appropriate transmission loss property $\Delta P_{loss}/P_{in}$ that is low within a relatively lower frequency band of about 50 MHz, i.e. a frequency band for transmitted signals, but is high within a relatively higher frequency band of several GHz, i.e. a frequency band for conduction noise, in comparison with the other ferrite films #2, #6, #11, #12, #13, and #15.

For further analysis directed to influence of each film's aspect ratio L/t to its permeability, ferrite films were formed on micro-strip line boards in a manner same as the above-explained manner, the micro-strip line boards were cut to obtain the shape of 4 mm square, and the permeability of each obtained 4 mm square was measured by using the shielded loop coil method. The analysis result is shown in the following table 2.

TABLE 2

| | ID | Target | Film Composition (mol %) | | | | L (mm) | t (µm) | L/t | µa' at 50 MHz | µb' at 50 MHz |
|---|---|---|---|---|---|---|---|---|---|---|---|
| | | | Fe | Ni | Zn | Co | | | | | |
| Example | #16 | MSL | 2.5 | 0.2 | 0.3 | 0.00 | 4.0 | 3.0 | 1333 | 40 | 40 |
| Example | #17 | MSL | 2.5 | 0.2 | 0.3 | 0.00 | 4.0 | 4.0 | 1000 | 39 | 39 |
| Comparative Example | #18 | MSL | 2.5 | 0.2 | 0.3 | 0.00 | 4.0 | 14.7 | 272 | 25 | 25 |

As understood from the table 2, each of the ferrite films #16 and #17 has an aspect ratio L/t of 1000 or more and provides relatively large permeability. On the other hand, the ferrite film #18 has another aspect ratio L/t smaller than 1000 and provides relatively small permeability.

For further analyses, four-layer printed circuit boards (a), (b) and (c) were formed. Each of the four-layer printed circuit boards (a), (b) and (c) has an inner magnetic layer that has the same composition and the same thickness as the ferrite film #16. The four-layer printed circuit boards (a), (b) and (c) are illustrated in FIGS. 5, 6 and 7, respectively.

Figure 5:
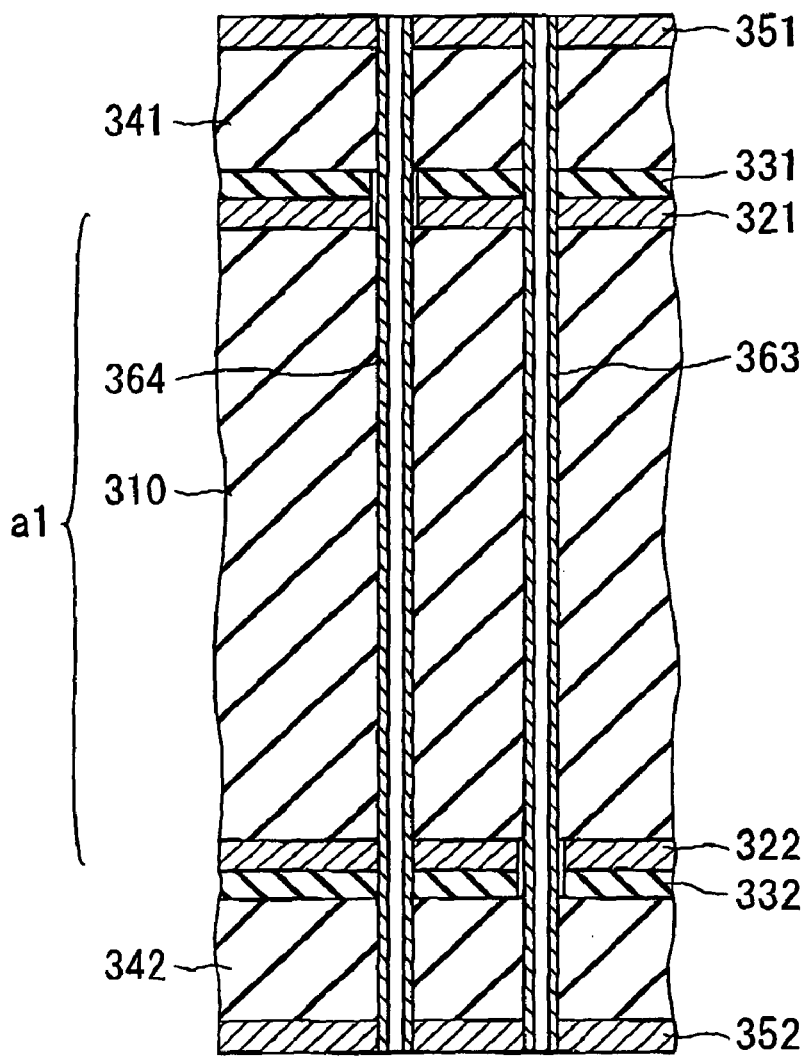
FIG. 5 is a cross-sectional view schematically showing a four-layer printed circuit board (a) according to an embodiment of the present invention.

With reference to FIG. 5, the printed circuit board (a) comprises two outer conductive layers and two inner conductive layers. The outer conductive layers serve as signal layers 351, 352, respectively. The inner conductive layers serve as a ground layer 321 and a power-supply layer 322, respectively. On the ground layer 321 and the power-supply layer 322, ferrite films 331 and 332 are formed so that the ferrite film 331 is positioned between the signal layer 351 and the ground layer 321 while the ferrite film 332 is positioned between the signal layer 352 and the power-supply layer 322. The reference numeral 310 indicates a dielectric layer of a core member. The reference numerals 341, 342 indicate dielectric layers of pre-impregnation sheets. Each of the dielectric layers 310, 341 and 342 is made of glass epoxy.

Figure 6:
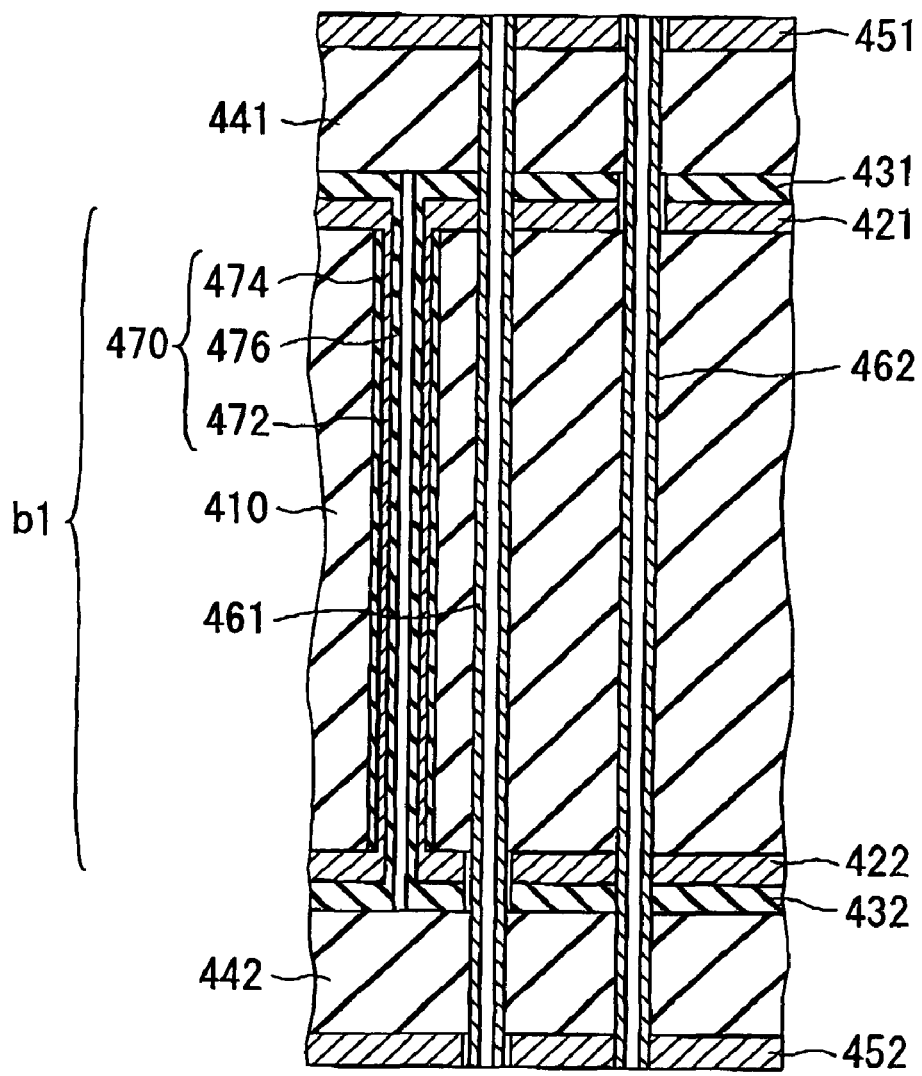
FIG. 6 is a cross-sectional view schematically showing a four-layer printed circuit board (b) according to another embodiment of the present invention.
Figure 7:
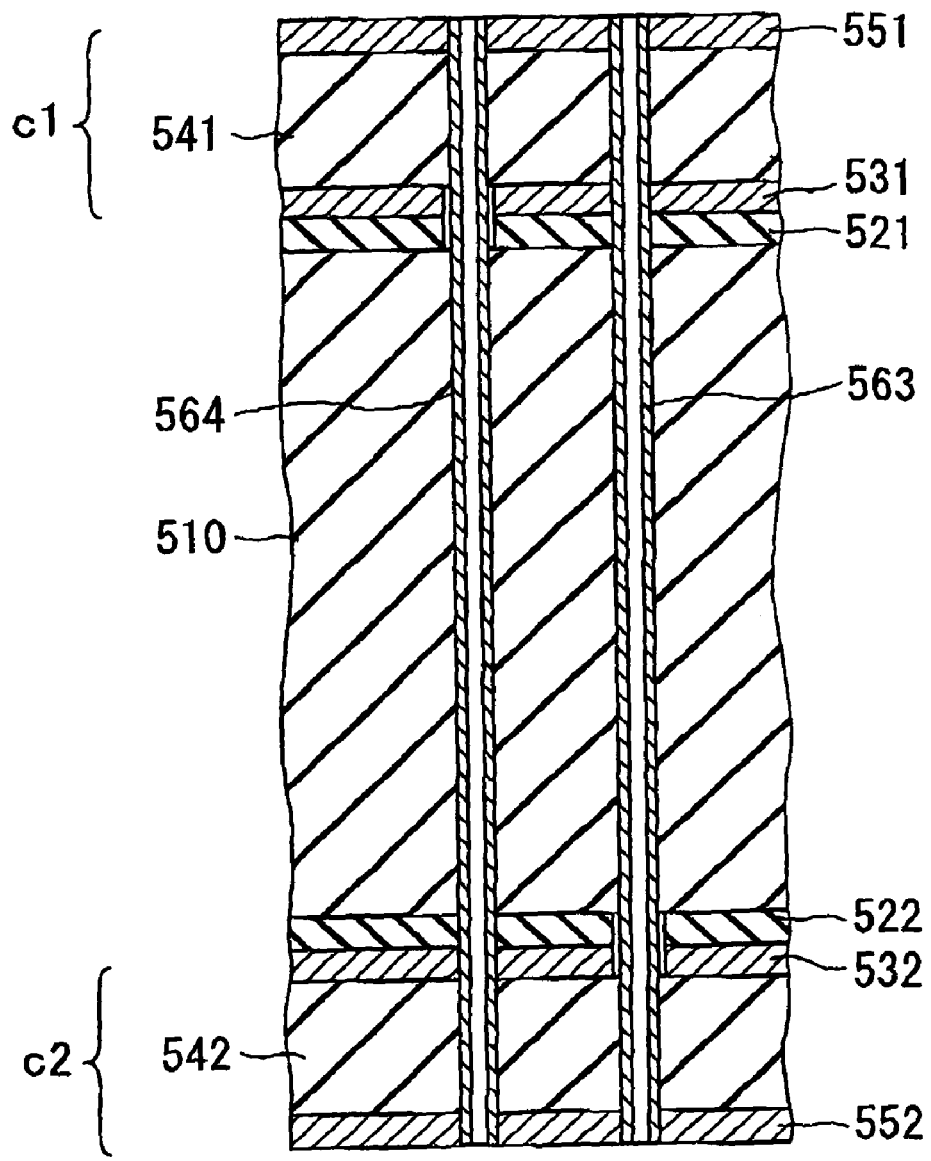
FIG. 7 is a cross-sectional view schematically showing a four-layer printed circuit board (c) according to still another embodiment of the present invention.
Figure 8:
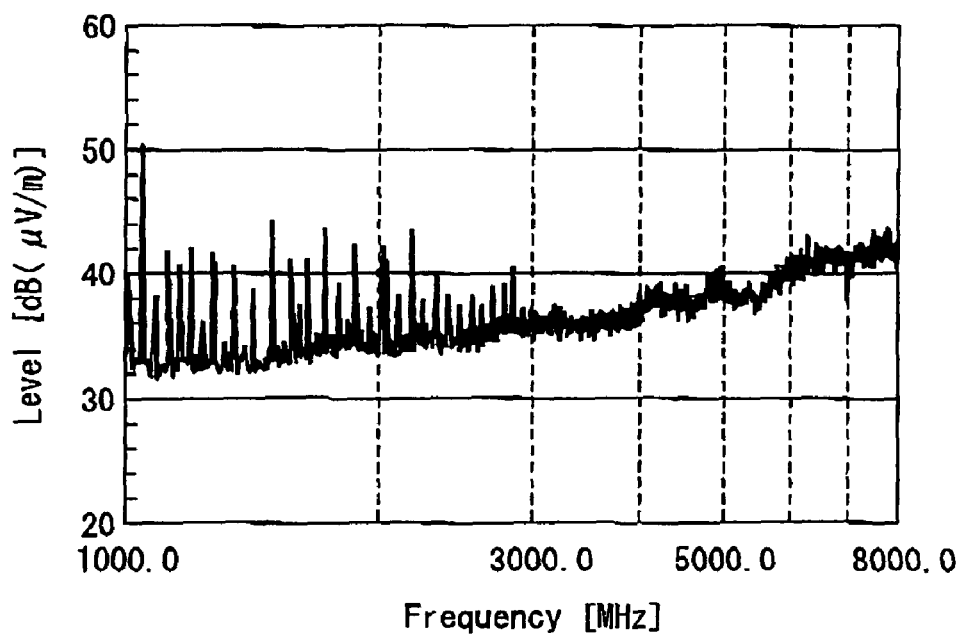
FIG. 8 is a graph showing a radiation noise spectrum of a four-layer printed circuit board (a') in accordance with a comparative example.
Figure 9:
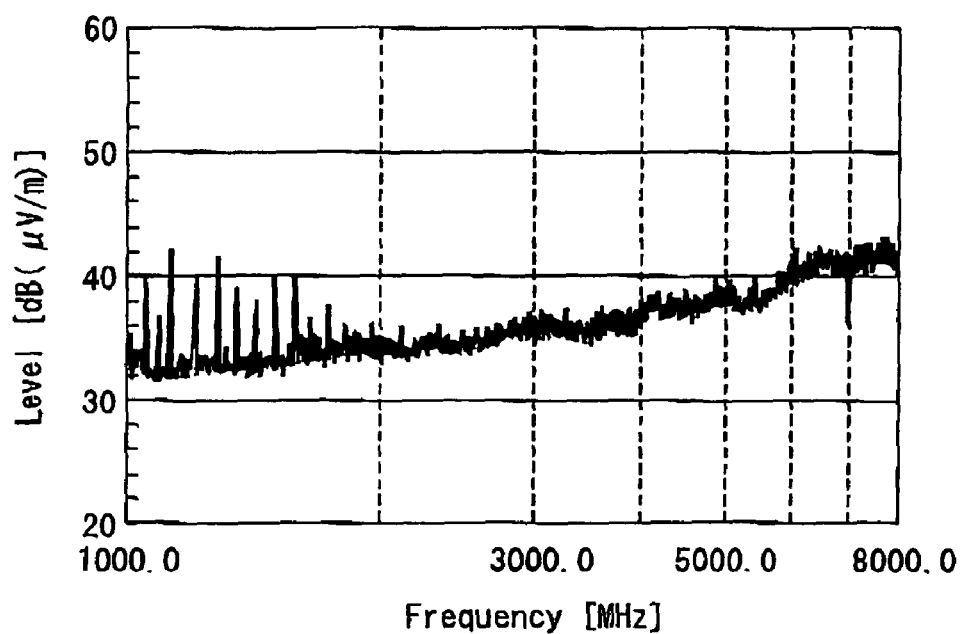
FIG. 9 is a graph showing a radiation noise spectrum of the four-layer printed circuit board (a) of FIG. 5.
Figure 10:
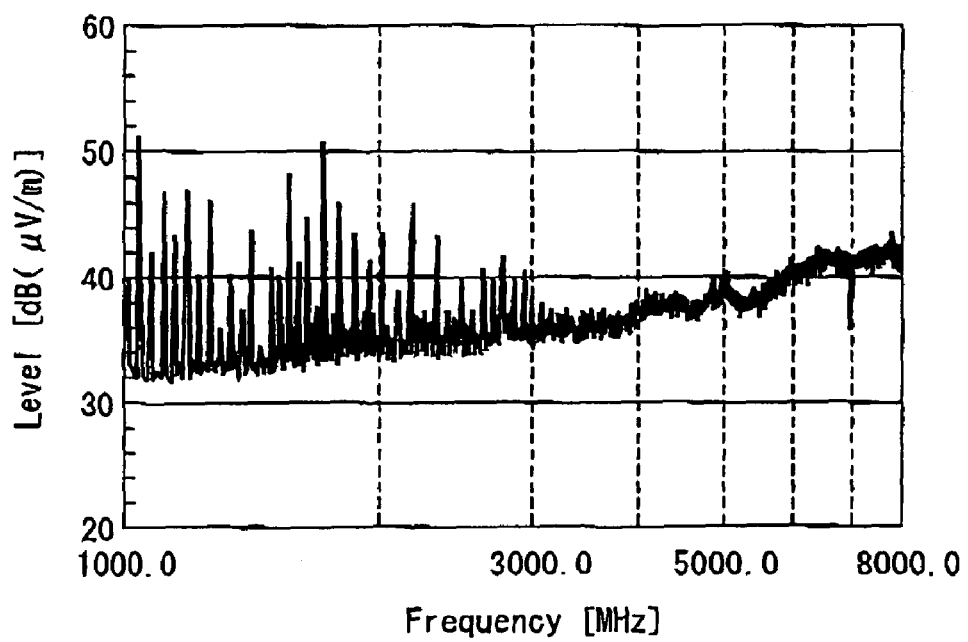
FIG. 10 is a graph showing a radiation noise spectrum of a four-layer printed circuit board (b') in accordance with another comparative example.
Figure 11:
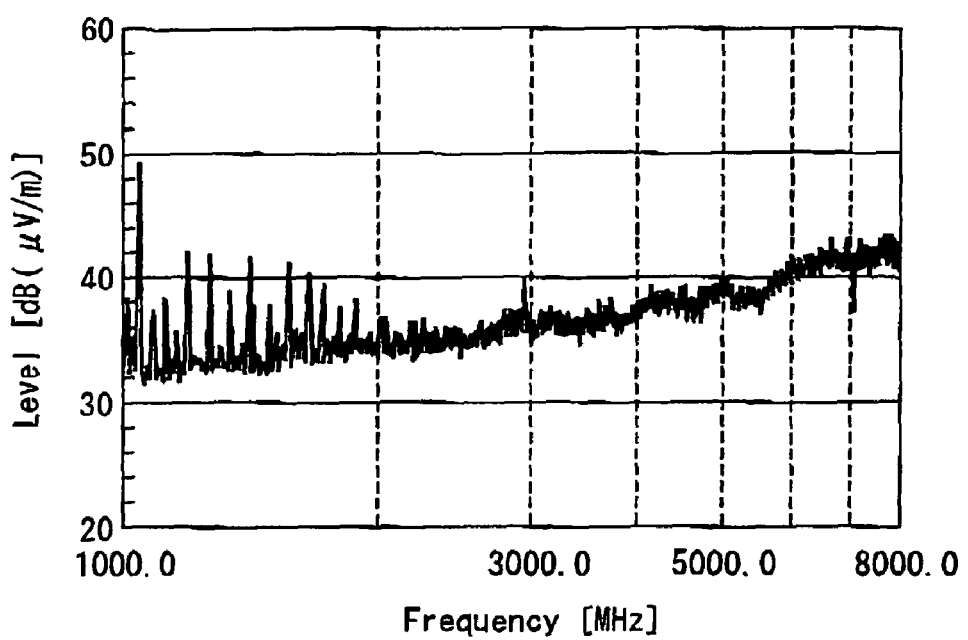
FIG. 11 is a graph showing a radiation noise spectrum of the four-layer printed circuit board (b) of FIG. 6.
Figure 12:
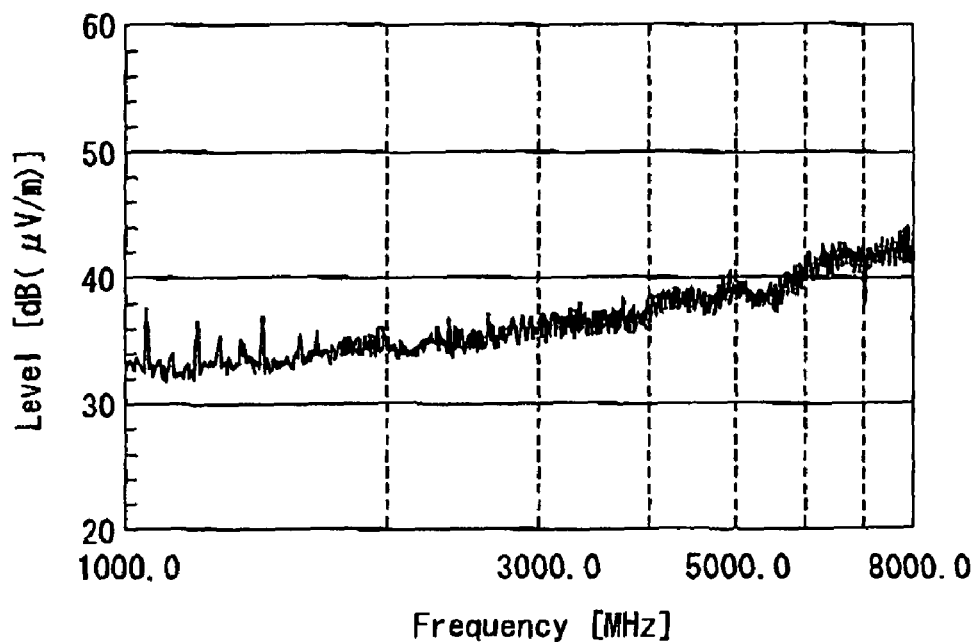
FIG. 12 is a graph showing a radiation noise spectrum of a four-layer printed circuit board (c') in accordance with a still another comparative example.
Figure 13:
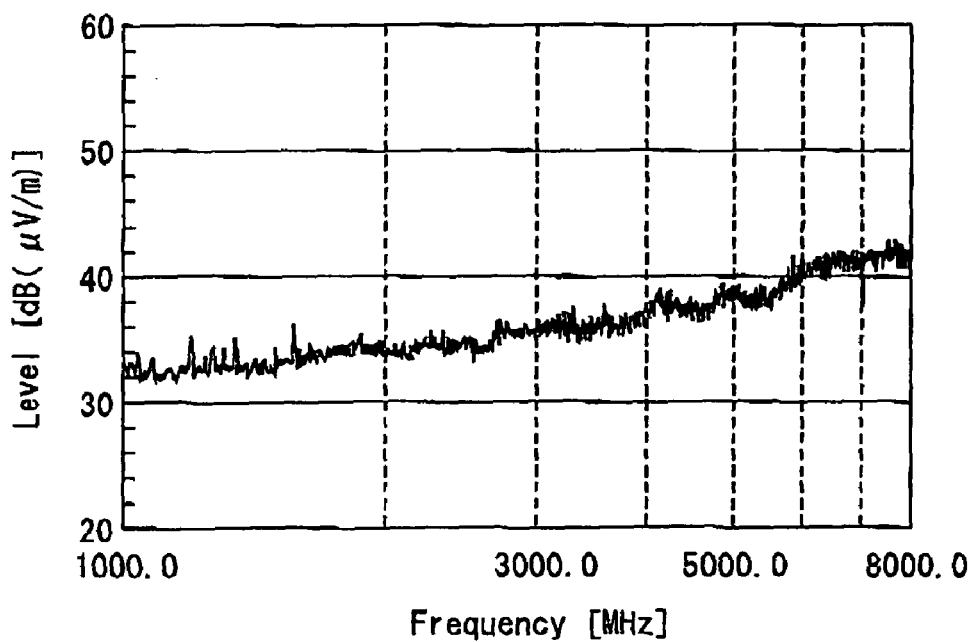
FIG. 13 is a graph showing a radiation noise spectrum of the four-layer printed circuit board (c) of FIG. 7.

With reference to FIG. 6, the printed circuit board (b) comprises two outer conductive layers and two inner conductive layers. The outer conductive layers serve as signal layers 451, 452, respectively, wherein the signal layer 451 includes power supply lines. The inner conductive layers serve as ground layers 421 and 422. On the ground layers 421 and 422, ferrite films 431 and 432 are formed so that the ferrite film 331 is positioned between the signal layer 351 and the ground layer 321 while the ferrite film 332 is positioned between the signal layer 352 and the power-supply layer 322. The reference numeral 410 indicates a dielectric layer of a core member. The reference numerals 441, 442 indicate dielectric layers of pre-impregnation sheets. Each of the dielectric layers 410, 441 and 442 is made of glass epoxy. The printed circuit board (b) further includes a via-hole 470 formed in the core member. The via-hole 470 comprises a cylindrical conductive via 472 and ferrite-plated films 474, 476 which are formed on the inner and the outer surfaces of the conductive via 472, respectively. The ferrite-plated film 476 formed on the inner surface of the conductive via 472 is connected between the ferrite films 341 and 342 in the thickness direction of the printed circuit board (b). One of the ferrite-plated films 474 and 476 may be omitted.

The above-mentioned printed circuit boards (a) and (b) were generally fabricated by forming ferrite films on the both surfaces of their core member, followed by fixing pre-impregnation sheets on the ferrite films, further followed by forming outer conductive layers on the pre-impregnation sheets.

In detail, as the core member of the printed circuit board (a), a double-sided glass epoxy printed circuit board a1 was prepared. The double-sided printed circuit board a1 comprised a glass epoxy board and copper films formed on the both surfaces of the glass epoxy board. The glass epoxy board had a thickness of 0.96 mm. Each of the copper films had a thickness of 0.035 mm and served as the ground layer 321 or the power-supply layer 322. Likewise, as the core member of the printed circuit board (b), a double-sided glass epoxy printed circuit board b1 was prepared. The double-sided printed circuit board b1 had a structure similar to the printed circuit board a1. The printed circuit board b1 was also formed with the ferrite-plated film 474 and the conductive via 472, in addition to the ground layers 421, 422.

Next, the ferrite films 331, 332 and 431, 432 were formed on the both surfaces of the printed circuit boards a1 and b1, respectively, by using the film formation apparatus of FIG. 3A under the same condition as the formation of the ferrite film #16, but the permanent magnets 103 were removed therefrom so that magnetic fields due to the permanent magnets 103 were not applied on the printed circuit boards a1, b1. Each of the thus obtained ferrite films 331, 332 and 431, 432 had a thickness of about 3 µm and was brought into intimate contact with the printed circuit board a1 or b1 without any clearance between the ferrite film and the printed circuit board a1 or b1. In the printed circuit board b1, the ferrite-plated film 476 was also formed on the inner surface of the conductive via 472 through the above-mentioned ferrite film formation process.

Next, the epoxy pre-impregnation sheets 341, 342 and the copper films 351, 352 were fixed on the both sides of the thus obtained core member a1 by thermocompression bonding, wherein each of the epoxy pre-impregnation sheets 341, 342 had a thickness of 0.2 mm, and each of the copper films 351, 352 had a thickness of 0.012 mm. Through-holes were formed therein. Copper plating was carried out to form conductive vias 363, 364 on the inner surfaces of the through-holes, wherein each conductive via had a thickness of 0.01 mm. Then, predetermined patterns were formed in the copper films 351, 352 to obtain the four-layer printed circuit board (a). Likewise, the epoxy pre-impregnation sheets 441, 442 and the copper films 451, 452 were fixed on the both sides of the thus obtained core member a1 by thermocompression bonding. Through-holes were formed therein. Copper plating was carried out to form conductive vias 461, 462 on the inner surfaces of the through-holes. Then, predetermined patterns are formed in the copper films 451, 452 to obtain the four-layer printed circuit board (b).

With reference to FIG. 7, the printed circuit board (c) comprises two outer conductive layers and two inner conductive layers. The outer conductive layers serve as signal layers 551, 552, respectively. The inner conductive layers serve as a ground layer 531 and a power-supply layer 532, respectively. On the ground layer 531 and the power-supply layer 532, ferrite films 521 and 522 are formed so that the ground layer 531 is positioned between the ferrite film 521 and the signal layer 551 while the power-supply layer 532 is positioned between the ferrite film 522 and the signal layer 552. The reference numeral 510 indicates a dielectric layer of a core member that is made of a pre-impregnation sheet in this example. The reference numerals 541, 542 indicate dielectric layers of double-sided printed circuit boards c1, c2, respectively. Each of the dielectric layers 510, 541 and 542 is made of glass epoxy.

The above-mentioned printed circuit board (c) were generally fabricated by preparing two double-sided printed circuit boards c1, c2, followed by forming the ferrite films 521, 522 on ones of the printed circuit boards c1, c2, respectively, further followed by fixing the thus obtained printed circuit boards c1, c2 on the both surfaces of the core member so that the ferrite films 521, 522 were positioned between the core member and the printed circuit boards c1, c2, respectively.

In detail, the double-sided glass epoxy printed circuit board c1 comprised a glass epoxy board and copper films formed on the both surfaces of the glass epoxy board. The glass epoxy board had a thickness of 0.2 mm. One of the copper films had a thickness of 0.012 mm and served as the signal layer 551. The other copper film had a thickness of 0.035 mm and served as the ground layer 531. The double-sided glass epoxy printed circuit board c2 had a structure similar to the printed circuit board c1 and comprised a glass epoxy board, the signal layer 552 and the power-supply layer 532 which were made of copper and were formed on the both surfaces of the glass epoxy board.

Next, the ferrite films 521, 522 were formed only on the ground layer 531 and the power-supply layer 532 of the printed circuit boards c1, c2, respectively, by using the film formation apparatus of FIG. 3A under the same condition as the formation of the ferrite film #16, but the permanent magnets 103 were removed therefrom so that magnetic fields due to the permanent magnets 103 were not applied on the printed circuit boards c1, c2.

Next, the epoxy pre-impregnation sheet 510 was inserted between the printed circuit boards c1, c2 so that the ferrite films 521, 522 were positioned directly on the pre-impregnation sheet 510, wherein the pre-impregnation sheet 510 had a thickness of 0.96 mm. Then, the printed circuit boards c1, c2 and the pre-impregnation sheet 510 were coupled with each other by thermocompression bonding. Through-holes were formed therein. Copper plating was carried out to form conductive vias 563, 564 on the inner surfaces of the through-holes, wherein each conductive via had a thickness of 0.01 mm. Then, predetermined patterns were formed in the copper films 551, 552 to obtain the four-layer printed circuit board (c).

Furthermore, comparative printed circuit boards (a'), (b') and (c') were also prepared, which had structures similar to the printed circuit boards (a), (b) and (c), respectively, except that the comparative printed circuit boards (a'), (b') and (c') had no ferrite film. On each of the printed circuit boards (a), (b), (c), (a'), (b') and (c'), a circuit for evaluation was formed, wherein the circuit comprised a programmable logic device (PLD), four driver IC chips, resistors, capacitors and so on, and the PLD worked at 75 MHz. Each of the printed circuit boards (a), (b), (c), (a'), (b') and (c') was disposed within an electric wave anechoic chamber. The PLDs were driven under the condition same as each other, and magnitudes of radiation noises were measured. The measurement results for the printed circuit boards (a), (a'), (b), (b'), (c) and (c') are shown in FIGS. 8 to 13, respectively. As apparent from FIGS. 8 to 13, the printed circuit boards (a), (b) and (c) drastically degrease the radiation noises in comparison with the printed circuit boards (a'), (b') and (c').

Although the above-mentioned ferrite-plated films are formed by using the film formation apparatus of FIG. 3A, the present invention is not limited thereto. Ferrite-plated films may be formed by using a film formation apparatus of another batch type or another film formation apparatus of an in-line type.

The present application is based on Japanese patent applications of JP2006-316209 filed before the Japan Patent Office on Nov. 22, 2006, JP2007-191929 filed before the Japan Patent Office on Jul. 24, 2007, and JP2007-219541 filed before the Japan Patent Office on Aug. 27, 2007, those contents being incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A multilayer printed circuit board including an inner magnetic layer essentially consisting of magnetic material, wherein:
   the inner magnetic layer has a thickness t and a minimum length L on a surface of the inner magnetic layer;
   the inner magnetic layer is formed so thin that conditions of $t \leq 50$ μm and $L/t \geq 1000$ are met;
   the inner magnetic layer has an imaginary part permeability $\mu''$ along a predetermined direction on the surface; and
   a product ($\mu'' \times t$) of the imaginary part permeability $\mu''$ and the thickness t is equal to or greater than 10 μm.

2. A multilayer printed circuit board comprising:
   an inner magnetic layer essentially consisting of magnetic material; and
   an inner conductive layer,
   wherein the inner magnetic layer is formed directly on the inner conductive layer, and wherein:
   the inner magnetic layer essentially consists of a ferrite film; and
   the ferrite film essentially consists of an oxide metal composition, the metal composition being represented by the formula of $Fe_a Ni_b Zn_c Co_d$, where:

$a+b+c+d=3.0$;

$2.1 \leq a \leq 2.7$;

$0.1 \leq b \leq 0.3$;

$0.1 \leq c \leq 0.7$; and $0 \leq d \leq 0.15$.

* * * * *